United States Patent [19]

Yamakawa

[11] Patent Number: 4,880,974

[45] Date of Patent: Nov. 14, 1989

[54] PHOTOELECTRIC SENSOR EMPLOYING CUSTOM LENS MEMBER

[75] Inventor: Masami Yamakawa, Yokohama, Japan

[73] Assignee: Wako Corporation, Kanagawa, Japan

[21] Appl. No.: 258,197

[22] Filed: Oct. 14, 1988

[51] Int. Cl.⁴ ............................................. H01J 3/14
[52] U.S. Cl. ................................... 250/216; 250/239; 350/444
[58] Field of Search ................ 250/216, 239; 350/442, 350/444, 445, 446

[56] References Cited

U.S. PATENT DOCUMENTS

| | | | |
|---|---|---|---|
| 3,059,113 | 10/1962 | McHenry . | |
| 3,897,133 | 7/1975 | Warner et al. | 350/444 |
| 4,554,448 | 11/1985 | Sillitto | 250/216 |
| 4,566,763 | 1/1986 | Greguss | 350/444 |
| 4,808,812 | 2/1989 | Tanaka et al. | 250/216 |

FOREIGN PATENT DOCUMENTS

| | | |
|---|---|---|
| 187180 | 7/1986 | European Pat. Off. . |
| 60-200132 | 10/1985 | Japan . |
| 997872 | 7/1965 | United Kingdom . |

Primary Examiner—Edward P. Westin
Assistant Examiner—Khaled Shami
Attorney, Agent, or Firm—Kramer, Brufsky & Cifelli

[57] ABSTRACT

A photoelectric sensor comprises a thin plate-shaped optical body, a circuit block and a casing for incorporating therein the optical body and the circuit block. A nearly infrared light incoming through a front surface of the casing is reflected upon a first reflective surface of the optical body. Following this first reflection, a second reflection is made upon a second reflective surface thereof. The light having passed through a light collective lens is received by a photoelectric converting element and converted into electric signals for output. Since the optical body comprises a plurality of reflective surfaces, an optical path up to the photoelectric converting element can be incorporated compactly within the thin plate-shaped optical body.

10 Claims, 7 Drawing Sheets

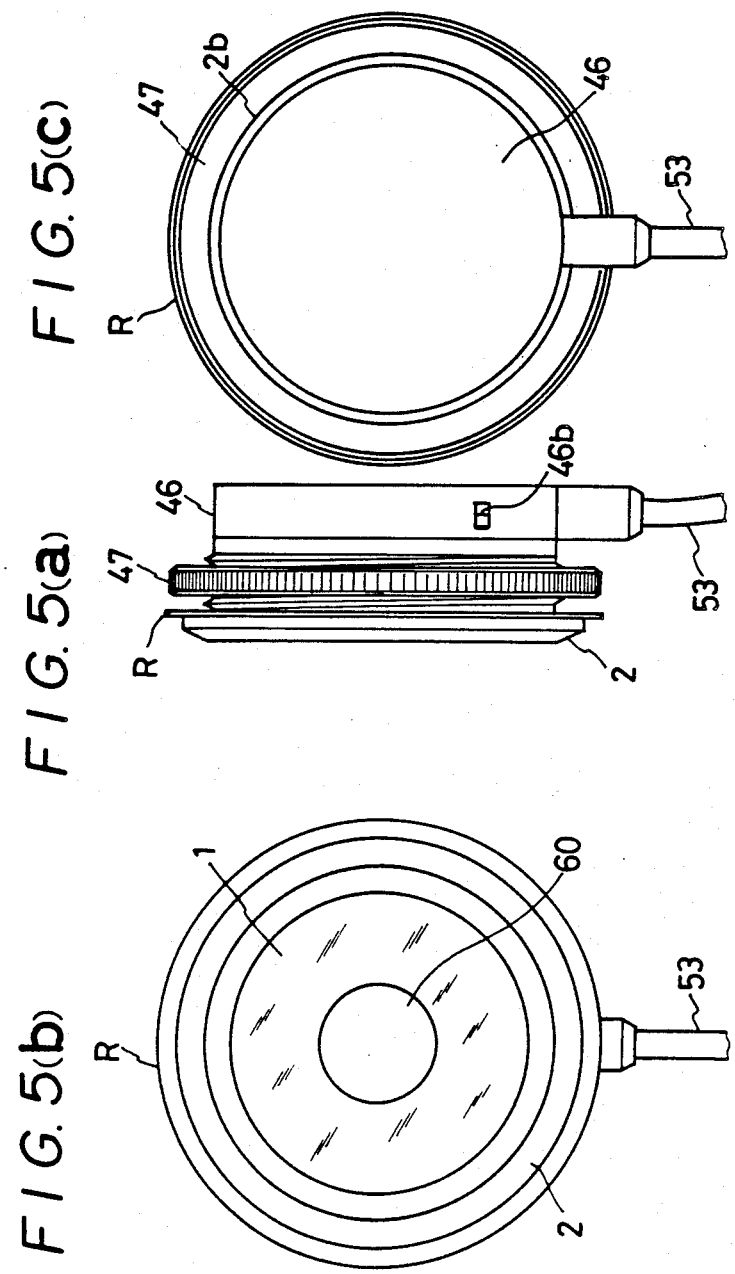

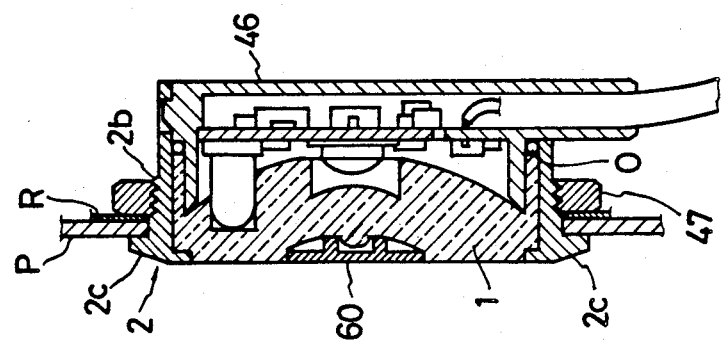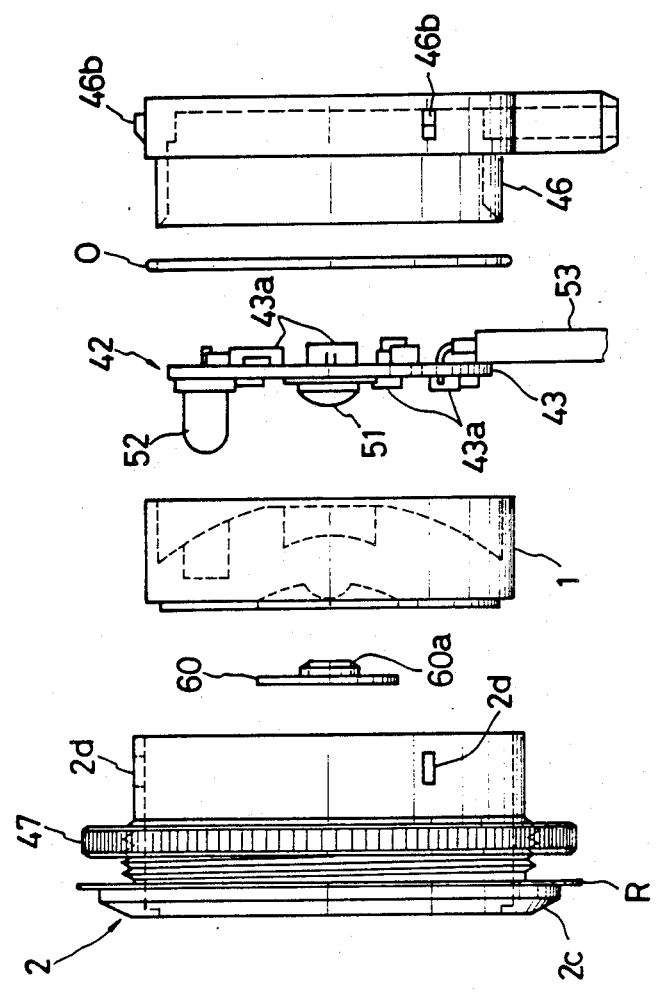

(PRIOR ART)

PHOTOELECTRIC SENSOR EMPLOYING CUSTOM LENS MEMBER

BACKGROUND OF THE INVENTION

1. Field of the Invention:

This invention relates to a photoelectric sensor comprising a light collecting system and a light receiving system.

2. Description of the Prior Art:

Since the photoelectric sensor enables a non-contact detection of persons or objects, it is used to detect any objects to be conveyed in various automated machines or conveyer lines, and any person's approach to an automatic door or the like.

FIG. 8 is a section view of a conventional photoelectric sensor, in which a convex lens is fixed in a circular opening formed on a front side of a casing. Disposed on a focal point of the convex lens is a photoelectric element comprising a light emitting element such as a light emitting diode and a light receiving element such as a phototransistor. Fixed upon an inner surface of a casing are a light driving circuit, a signal amplifying circuit, a motion indicating lamp, a variable resistor and other parts so as not to hinder an optical path between the convex lens and the photoelectric element. All of the aforesaid components are electrically connected with each other. An electric wire connected to an input terminal and an output terminal is connected to a device outside the casing.

Referring to FIG. 8, symbol A is a convex lens for light collection which is disposed on a front side of a casing B. Numeral 51 is a photoelectric element disposed on a focal point of the convex lens A. Numeral 22 is a wiring substrate, numeral 23 are various electronic parts disposed upon the wiring substrate 22, and numeral 24 is a motion indicating lamp.

Numeral 31 is a rear panel of the casing B. Symbol C is a wire for connecting the motion indicating lamp 24 and the wiring substrate 22 to each other. Such a photoelectric sensor can be installed on a certain place by means of blackets and screws.

In recent years, the structrure of the photoelectric sensor becomes more small-sized and more compact to meet user's requirements. Yet, there are the following problems hindering the manufacture of a small-sized photoelectric sensor.

Firstly, when disposing necessary parts upon the inner wall of the casing of the photoelectric sensor, an assembler is forced to insert such tools as a driver, a pinset, a soldering tool or the like into the interior of the casing. Accordingly, as the casing becomes smaller, assembling becomes more cumbersome. Thus, to make the photoelectric sensor smaller is contradictory to a better efficiency of assembling.

Secondly, since a convex lens is adapted for a light collecting means, a conically enlarged space must be formed in an optical path toward the photoelectric element. More particularly, in order to enhance the performance of the photoelectric sensor, it is desirable to increase the light incoming volume by enlarging a caliver of the convex lens and to minimize the influence of any outer disturbing light by extending a focal distance of the convex lens.

Therefore, it is needed to dispose a lens having a larger caliver and a longer focal distance, so that a larger conical space must be formed. In this regard, to make the photoelectric sensor smaller is contradictory to the betterment of optical properties.

Thirdly, handling of the conventional electric sensor is inconvenient. Since it is large-sized, it is easily touched by persons or objects, thereby an optical axis is biassed and it cause malfunction.

Finally, when some dusts or oily matters will be stuck to a body of the photoelectric sensor, cleaning is not easy.

BRIEF SUMMARY OF THE INVENTION

It is therefore a general object of this invention to provide a photoelectric sensor which brings a good fabricability, a superior optical performance and a suitable operability.

More specifically, the photoelectric sensor according to this invention comprises: a connecting cylinder for connecting an optical body integrally to a circuit block disposed therebehind; a transparent resinous casing for incorporating therein the optical body and the circuit block interconnected with each other; an electric wire connector disposed on an outer surface of said circuit block; and a cover body for covering a rear opening of said transparent resinous casing for incorporating all aforesaid components.

The optical body is made of a transparent resinous material and has a nearly crescent-shaped section. One surface of the optical body is formed as a circular objective surface, while the other surface thereof is formed as a circuit convex surface.

The circular objective surface is, on a central part thereof, provided with a first recess having a concave bottom surface of a diameter one-third smaller than the circular convex surface and a convex protrusion as an objective lens.

The circular convex surface is, on a central part thereof, provided with a second recess having a convex bottom surface of a slightly smaller diameter than the concave bottom surface as a collective lens means so as to oppose to the first recess.

The concave bottom surface in the first recess excluding the convex protrusion is formed as a second reflective surface by a vacuum evaporating plating means.

The circular convex surface excluding said second recess is formed as a first reflective surface by a vacuum evaporating plating means.

The first reflective surface is, on a surface thereof, provided with an opening to transmit a luminous flux of a motion indicating lamp toward the circular obejctive surface.

The circuit block is, on a front surface thereof, provided with a photoelectric converting element and the motion indicating lamp, while, on both surfaces thereof, provided with a circuit substrate and a terminal substrate.

BRIEF DESCRIPTION OF THE ACCOMPANYING DRAWINGS

FIGS. 1(a), 1(b) and 1(c) are views of an outer appearance of a photoelectric sensor according to a first embodiment of this invention, in which FIG. 1(a) is a side view, FIG. 1(b) is a front view and FIG. 1(c) is a rear view.

Figure 4A:
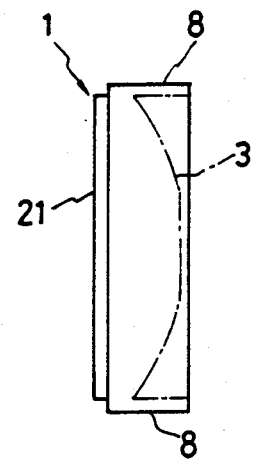
Figure 4B:
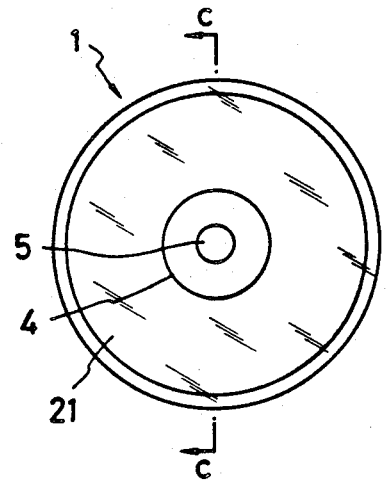
Figure 4C:
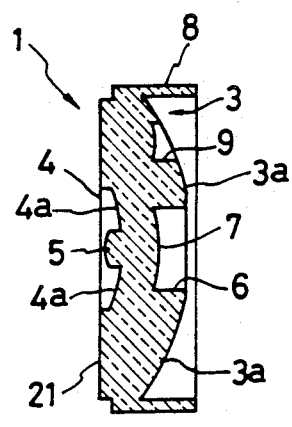
Figure 4D:
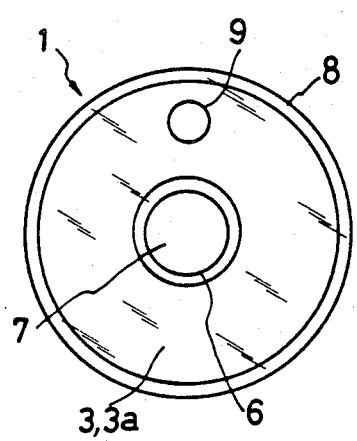

FIGS. 4(a), 4(b), 4(c) and (d) are views of an optical body in the first embodiment, in which FIG. 4(a) is a side view, FIG. 4(b) is a front view, FIG. 4(c) is a section view taken on line c—c of FIG. 4(b), and FIG. 4(d) is a rear view.

FIGS. 5(a), 5(b) and 5(c) are views of an outer appearance of a photoelectric sensor according to a second embodiment of this invention, in which FIG. 5(a) is a side view, FIG. 5(b) is a front view and FIG. 5(c) is a rear view.

FIG. 6 is an exploded side view of the photoelectric sensor in the second embodiment.

FIG. 7 is a vertical section view of a whole structure of the photoelectric sensor in the second embodiment.

Figure 8:
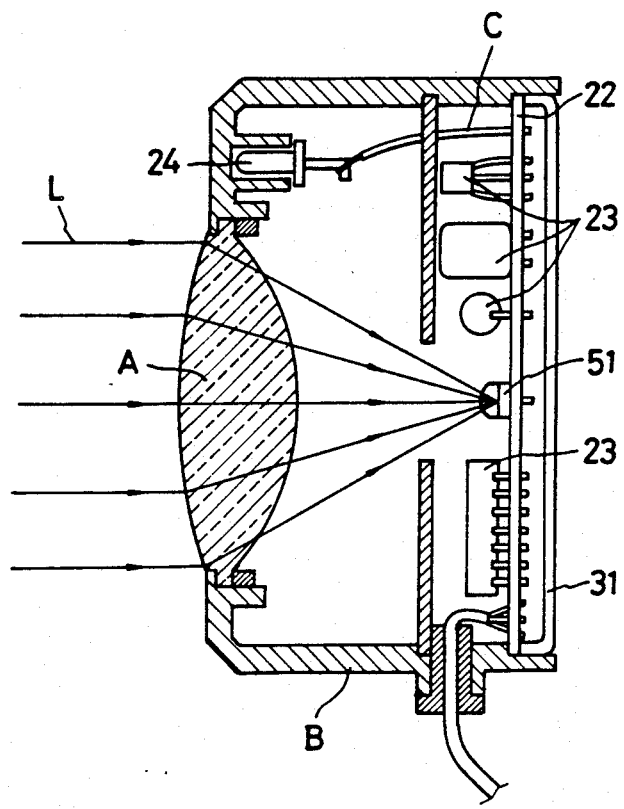

FIG. 8 is a vertical section view of a conventional photoelectric sensor.

DETAILED DESCRIPTION OF PREFERRED EMBODIMENTS

A first embodiment of this invention will now be described with reference to FIGS. 1(a) to 4.

FIGS. 1(a), 1(b) and 1(c) show an outer appearance of the photoelectric sensor according to this invention.

Numeral 1 is a transparent resinous optical body having a thin plate shape. Numeral 2 is a transparent resinous casing having an objective surface 2a. An outer surface of the casing 2 is provided with a screw thread portion 2b. Numeral 2c is a ring-shaped stopper fixed immediately behind the objective surface 2a.

Numeral 41 is a connecting cylinder, in which the optical body 1 and a circuit block 42 coupled thereto are integrally incorporated. Numeral 45 is a wire connector disposed behind the circuit block 42. Mounted on a rear surface of the casing 2 is a cover body 46 having a convex portion 46b to incorporate the wire connector 45 in the cover body 46.

Figure 1:
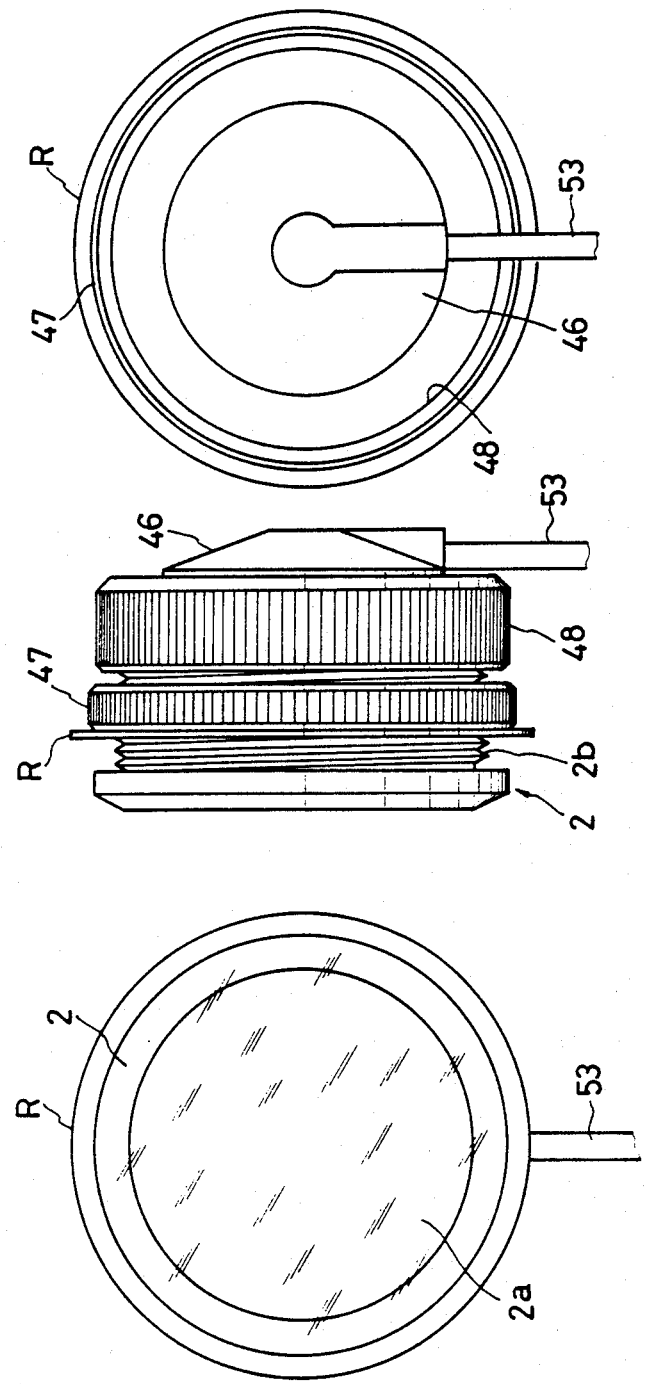
Figure 2:
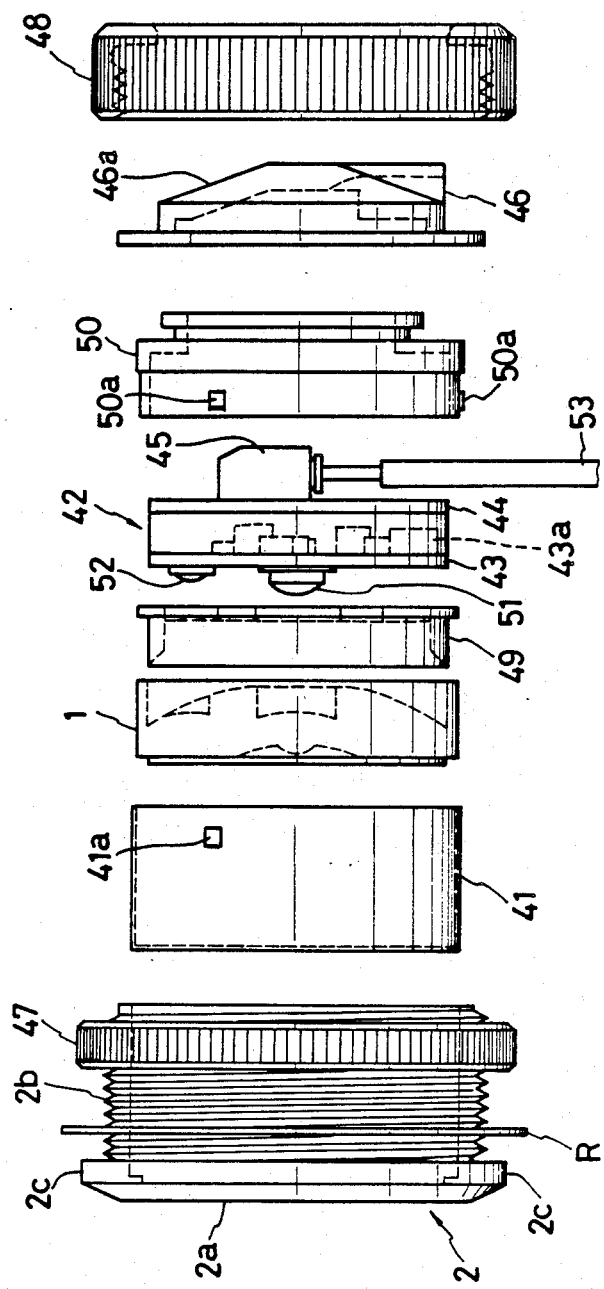
FIG. 2 is an exploded side view of the photoelectric sensor in the first embodiment.
Figure 3:
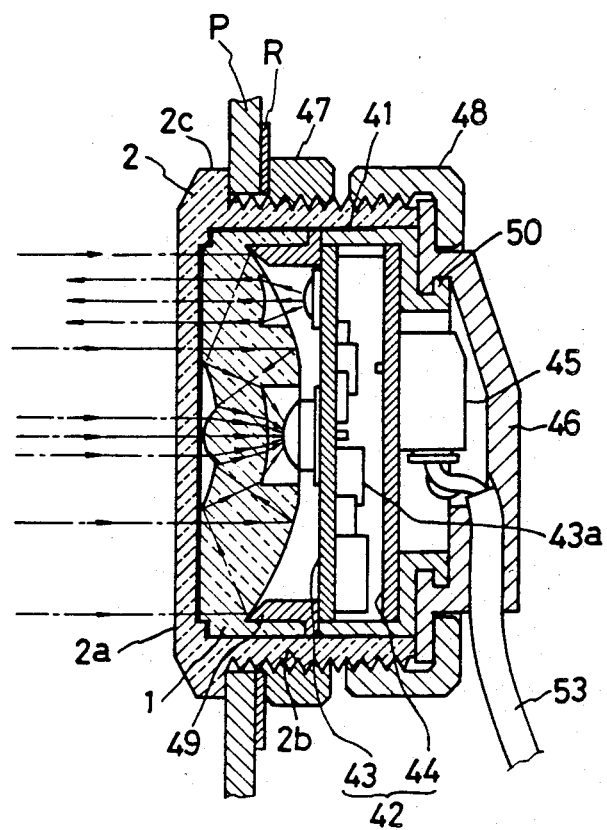
FIG. 3 is a vertical section view of a whole structure of the photoelectric sensor in the first embodiment.

Numeral 47 is a lock nut engageable with the screw thread portion 2b of the casing 2. As shown in FIG. 3, the photoelectric sensor is fixed upon a panel P which is clamped between the stopper 2c, a rubber washer R and the lock nut 47.

Numeral 48 is a clamping nut engageable with the screw thread portion 2b of the casing 2 to fix the cover body 46 with the casing 2.

Numeral 49 is a resinous cylindrical spacer for connecting the optical body 1 and the circuit block 42 to each other. Numeral 50 is a resinous cylindrical spacer fitted in the connecting cylinder 41. The cylindrical spacer 50 is to fix the optical body 1 and the circuit block 42 which are incorporated in the connecting cylinder 41.

The outer surface of the connecting cylinder 41 is provided with three openings 41a which are spaced each other with an interval of 120 degrees so as to engage with three protrusions 50a formed on the outer surface of the cylindrical spacer 50.

The circuit block 42 has a cylindrical shape and comprises a circular circuit substrate 43 and a circular terminal substrate 44. The circuit substrate 43 is, upon its front surface, provided with a photoelectric converting element 51 and a motion indicating lamp 52 as a light emitting diode, while, upon its rear surface, provided with electronic circuit parts 43. Further, a certain resinous material is filled between the circuit substrate 43 and the terminal substrate 44.

The construction of the optical body 1 will now be described in connection with FIGS. 4(a), 4(b), 4(c) and 4(d).

The transparent resinous optical body 1 has a crescent-shaped section and a diameter of 24 mm. Numeral 21 is a circular flattened objective surface which is formed toward an object to be detected. (The objective surface 21 has a diameter of 22.2 mm.)

When detecting any objects existing within about 1 meter distant therefrom, the objective surface 21 is preferably formed as a gently convex surface.

Numeral 3 is a circular convex surface having a diameter of 22.2 mm (R=16.75 mm, aspherical). The circular convex surface 3 is opposed immediately to a photoelectric converting element 51.

As illustrated clearly in FIGS. 4(b) and 4(c), formed upon a central part of the objective surface 21 is a first recess 4 having a concave surface of a diameter of 9 mm (R=12 mm) which is nearly equivalent to one-third of the circular convex surface 3.

Further, the first recess 4 is, upon its concave bottom surface, provided with a first reflective surface 4a which is formed by a vacuum evaporating plating process. Numeral 5 is a convex protrusion (2.8 mm in diamter) of an objective lens formed upon a central part thereof.

Further, formed upon a central part of the circular convex surface 3 is a second recess 6 which is opposed to the first recess 4. Formed within the second recess 6 is a convex bottom surface 7 as a collective lens means (R=10.57 mm, spherical) which is slightly smaller than the diameter of the concave bottom surface of the first recess 4. (The ratio of both surfaces is 9:7.) The photoelectric converting element 51 of the circuit block 42 is directly opposed to the second recess 6.

Numeral 8 is a skirt (about 3.7 mm in height) formed upon a circumference of the circular convex surface 3. Numeral 9 is ah opening formed on the circular convex surface 3 in order to radiate a luminous flux of the motion indicating lamp 52 through the objective surface 21. The opening 9 has a convex bottom surface. Alternatively, it may be formed as a Fresnel surface. Further, the motion indicating lamp 52 may be incorporated in the opening 9. Numeral 3a is a first reflective surface formed upon the circular convex surface 3 by means of a vacuum evaporating plating process.

According to this embodiment, the photoelectric sensor has an outer diameter of 30 mm and a thickness of about 17 mm.

An operation of this embodiment will be described.

A nearly infrared light incoming from the circular objective surface 21 through the front surface 2a of the casing 2 is reflected upon the first reflective surface 3a and transferred to the second reflective surface 4a. Then, a second reflection occurs. Due to this second reflection, the light passing through the light collecting means 7 is collected upon the photoelectric converting element 51, and converted into electric signals for output.

Further, the light incident upon the convex protrusion 5 as an objective lens is transferred directly to the photoelectric converting element 51 through the light collecting means 7, and converted into electric signals for output.

Any variation of the incoming light volume is immediately converted into electric signals, so that any persons or objects in a detecting space can be detected precisely.

The aforesaid description is applied to the case that the photoelectric sensor performs a function of a light receiving device. When it performs a function of a light transmitting device, the light is transmitted from the photoelectric converting element, namely a light transmitting direction is contrary to that in the aforesaid case.

Since the optical body 1 comprises the first reflective surface 3a and the second reflective surface 4a, an optical path to the photoelectric element 51 from a circular objective surface of the convex lens A as shown in a conventional photoelectric sensor in FIG. 8 can be formed compactly in a folded state within the thin plate-shaped optical body 1. The light from the motion indicating lamp 52 as a light emitting diode is radiated to the objective surface of the optical body 1 through the light collecting lens means 9.

A second embodiment of this invention will be described in connection with FIGS. 5(a), 5(b), 5(c), 6 and 7.

Since the components in the second embodiment have the same numerals as the first embodiment, their description will be omitted.

The casing 2 is, upon its outer surface, provided with the ring-shaped stopper 2c, the screw thread portion 2b and three openings 2d formed with an interval of 120 degrees Inserted into the three openings 2d are three protrusions 46b formed on an outer surface of the cover body 46.

Numeral 60 is a circular protector to be fitted in the first recess 4 of the optical body 1 in order to protect the second reflective surface 4a. The circular protector 60 which is made of a transparent resilient material comprises a resilient opening 60a for supporting the objective lens 5 of the optical body 1.

As described previously, the circuit block 42 comprises the circuit substrate 43, the photoelectric converting element 51 formed on one surface thereof, the motion indicating lamp 52 and the electronic circuit parts 43a formed upon both surfaces of the circuit block 42.

The electric wire 53 for input and output is directly connected to the circuit substrate 43 at a lower end of the photoelectric sensor. Accordingly, the photoelectric sensor in this embodiment is formed thinner than that in the first embodiment. Symbol O is an O-ring disposed between the optical body 1 and the cover body 46.

As shown in FIG. 7, the optical body 1 is incorporated in the casing 2 so that the first recess 4 is formed on a front surface of the optical body 1.

Subsequently, the cover body 46 having the circuit block 42 is incorporated in the casing 2 so as to oppose to a rear surface of the optical body 1 by way on the O-ring O.

The construction of the optical body is the same as the first embodiment. According to the second embodiment, the photoelectric sensor is a small-sized and thin disk having an outer diameter of 30 mm and a thickness of about 11 mm.

The operation of the second embodiment is the same as the first embodiment.

According to one aspect of the second embodiment, the front surface of the casing is open, so that the light transmission of the second embodiment is more superior to that of the first embodiment.

The effects and advantages of the photoelectric sensor according to this invention will be summarized as follows.

Any cumbersome manual assembling such as insertion of components into a narrow interior of the casing has completely been removed, so that the photoelectric sensor according to this invention can be mass-produced by means of various robot machines. Thus, the manufacturing cost can be reduced greatly.

Further, a conical space upon an optical path is incorporated compactly in the interior of the optical body of a crescent-shaped section. Thus, the optical body is formed very thin and small-sized. For example, its thickness is as small as about one-third of a conventional optical body.

Accordingly, such a small-sized photoelectric sensor according to this invention is mounted simply on any wall in factories, offices, shops or houses without injuring any aesthetic appearance of surroundings.

Further, since the caliber of the optical body is larger and its focal distance is long, the light incoming volume is increased and any outer disturbing light is not influential.

Accordingly, when one photoelectric sensor having the function of a light transmitting device is opposed to another photoelectric sensor having the function of a light receiving device, it is possible to extend its opposing distance greatly.

Further, when the photoelectric sensor is of a reflective type, it is possible to extend a distance between the photoelectric sensor and an object to be detected, and to make its detection easier.

What is claimed is:

1. In a photoelectric sensor comprising: a connecting cylinder for connecting an optical body integrally to a circuit block disposed therebehind; a transparent resinous casing for incorporating therein said optical body and said circuit block interconnected with each other; an electric wire connector disposed on an outer surface of said circuit block; and a cover body for covering a rear opening of said transparent resinous casing for incorporating therein all aforesaid components, said optical body being made of a transparent resinous material and having a nearly crescent-shaped section, one surface of said optical body being formed as a circular objective surface, while the other surface thereof being formed as a circular convex surface;

said circular objective surface being, on a central part thereof, provided with a first recess having a concave bottom surface of a diameter one-third smaller than said circular convex surface and a convex protrusion as an objective lens;

said circular convex surface being, upon a central part thereof, provided with a second recess having a convex bottom surface of a slightly smaller diameter than said concave bottom surface as a collective lens means so as to oppose to said first recess;

said concave bottom surface in said first recess excluding said convex protrusion being formed as a second reflective surface by a vacuum evaporating plating means;

said circular convex surface excluding said second recess being formed as a first reflective surface by a vacuum evaporating plating means and being, on its circumference, provided with a skirt means;

said first reflective surface being, on a surface thereof, provided with an opening to transmit a luminous flux of a motion indicating lamp toward said circular objective surface;

said circuit block being, on a front surface thereof, provided with a photoelectric converting element and said motion indicating lamp, while, on both surfaces thereof, provided with a circuit substrate and a terminal substrate.

2. A photoelectric sensor as claimed in claim 1, in which said casing comprises a screw thread portion on its outer surface, a lock nut engageable with said screw thread portion and a stopper formed on an outer surface of said casing, and said cover body is fixed with a clamping ring engageable with said screw thread portion.

3. A photoelectric sensor as claimed in claim 1, in which a soft plastic spacer is disposed between said optical body and said circuit block.

4. A photoelectric sensor as claimed in claim 1, in which a resinous material is filled between said circuit substrate and said terminal substrate on said circuit block.

5. A photoelectric sensor as claimed in claim 1, in which a cylindrical spacer disposed between said circuit block and said cover plate.

6. In a photoelectric sensor comprising an optical body, a circuit block, a cylindrical casing for incorporating therein said optical body and said circuit block, and a cover body fitted to said casing, said optical body being made of a transparent resinous material and having a nearly crescent-shaped section, one surface of said optical body being formed as a circular objective surface, while the other surface thereof being formed as a circular convex surface;

said circular objective surface being, on a central part thereof, provided with a first recess having a concave bottom surface of a diameter one-third smaller than said circular convex surface and a convex protrusion as an objective lens;

said circular convex surface being, upon a central part thereof, provided with a second recess having a convex bottom surface of a slightly smaller diameter than said concave bottom surface as a collective lens means so as to oppose to said first recess;

said concave bottom surface in said first recess excluding said convex protrusion being formed as a second reflective surface by a vacuum evaporating plating means;

said circular convex surface excluding said second recess being formed as a first reflective surface by a vacuum evaporating plating means and being, on its circumference provided with a skirt means;

said first reflective surface being, on a surface thereof, provided with an opening to transmit a luminous flux of a motion indicating lamp toward said circular obejective surface; and said first recess being covered by a transparent protector means to protect said second reflective surface.

7. A photoelectric sensor as claimed in claim 6, in which said casing comprises a screw thread portion on its outer surface, a lock nut engageable with said screw thread portion and a stopper formed on an outer surface of said casing.

8. A photoelectric sensor as claimed in claim 6, in which said circuit block is, on one surface thereof, provided with said photoelectric converting element and said motion indicating lamp, while, on both surfaces thereof, provided with said circuit substrate having electronic circuit parts.

9. A photoelectric sensor as claimed in claim 6, in which a resinous material is filled between said circuit block and said cover body.

10. A photoelectric sensor as claimed in claim 6, in which said electric wire is connected directly to said circuit substrate through an outer surface of said casing.

* * * * *